United States Patent
Wu et al.

(10) Patent No.: US 10,658,186 B2
(45) Date of Patent: *May 19, 2020

(54) METHOD OF FORMING SEMICONDUCTOR DEVICE USING TITANIUM-CONTAINING LAYER AND DEVICE FORMED

(71) Applicant: TAIWAN SEMICONDUCTOR MANUFACTURING COMPANY, LTD., Hsinchu (TW)

(72) Inventors: Chia-Yang Wu, Tainan (TW); Shiu-Ko Jangjian, Tainan (TW); Keng-Chuan Chang, Hsinchu (TW); Ting-Siang Su, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/231,836

(22) Filed: Dec. 24, 2018

(65) Prior Publication Data
US 2019/0148152 A1    May 16, 2019

Related U.S. Application Data

(63) Continuation of application No. 15/723,541, filed on Oct. 3, 2017, now Pat. No. 10,163,643.
(Continued)

(51) Int. Cl.
*H01L 21/285* (2006.01)
*H01L 29/78* (2006.01)
(Continued)

(52) U.S. Cl.
CPC ...... *H01L 21/28518* (2013.01); *H01L 21/285* (2013.01); *H01L 21/2855* (2013.01); *H01L 21/768* (2013.01); *H01L 21/76843* (2013.01); *H01L 29/165* (2013.01); *H01L 29/40* (2013.01); *H01L 29/401* (2013.01); *H01L 29/41766* (2013.01); *H01L 29/45* (2013.01); *H01L 29/665* (2013.01); *H01L 29/66636* (2013.01); *H01L 29/78* (2013.01); *H01L 29/7848* (2013.01); *H01L 21/76805* (2013.01); *H01L 21/76855* (2013.01); *H01L 21/76897* (2013.01)

(58) Field of Classification Search
CPC ............ H01L 21/28518; H01L 29/401; H01L 29/66636; H01L 29/165; H01L 29/7848; H01L 29/45
See application file for complete search history.

(56) References Cited

U.S. PATENT DOCUMENTS 8,629,510 B2   1/2014   Alptekin et al.
9,741,812 B1   8/2017   Adusumilli et al.
(Continued)

*Primary Examiner* — Syed I Gheyas
(74) *Attorney, Agent, or Firm* — Hauptman Ham, LLP

(57) ABSTRACT

A method of forming a semiconductor device includes depositing a titanium-containing material over a source/drain (S/D), wherein an energy of depositing the titanium-containing material is sufficient to cause re-deposition of a material of the S/D along sidewalls of a dielectric layer adjacent the S/D to form protrusions extending from a top surface of the S/D. The method further includes annealing the semiconductor device to form a silicide layer in the S/D and in the protrusions.

20 Claims, 8 Drawing Sheets

Related U.S. Application Data

(60) Provisional application No. 62/434,232, filed on Dec. 14, 2016.

(51) Int. Cl.
  *H01L 29/165* (2006.01)
  *H01L 29/45* (2006.01)
  *H01L 29/66* (2006.01)
  *H01L 29/40* (2006.01)
  *H01L 29/417* (2006.01)
  *H01L 21/768* (2006.01)

(56) References Cited

U.S. PATENT DOCUMENTS

| | | |
|---|---|---|
| 2007/0187767 A1 | 8/2007 | Yasutake |
| 2013/0049219 A1 | 2/2013 | Tsai et al. |
| 2013/0175606 A1 | 7/2013 | Cheng et al. |
| 2015/0041854 A1 | 2/2015 | Wang et al. |
| 2017/0200824 A1* | 7/2017 | Yu .................. H01L 21/823814 |
| 2017/0221895 A1 | 8/2017 | Lii |

\* cited by examiner

METHOD OF FORMING SEMICONDUCTOR DEVICE USING TITANIUM-CONTAINING LAYER AND DEVICE FORMED

PRIORITY CLAIM

This application is a continuation of U.S. application Ser. No. 15/723,541, filed Oct. 3, 2017, which claims the priority of U.S. Provisional Application No. 62/434,232, filed Dec. 14, 2016, which are incorporated herein by reference in their entireties.

BACKGROUND

Semiconductor devices including strained source/drain (S/D) regions help to increase conductivity in a channel region of the semiconductor device. Strained S/D regions have a different lattice structure from a surrounding substrate. The difference in lattice structure exerts pressure on the channel region of the semiconductor device to increase the conductivity.

Annealing processes are used to form silicide layers in the strained S/D regions of semiconductor devices. The annealing process heats the semiconductor device in order to cause a reaction between at least silicon and a metallic material. Due to the increase in temperature, energy within the strained S/D region increases and the odds of material diffusing increases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
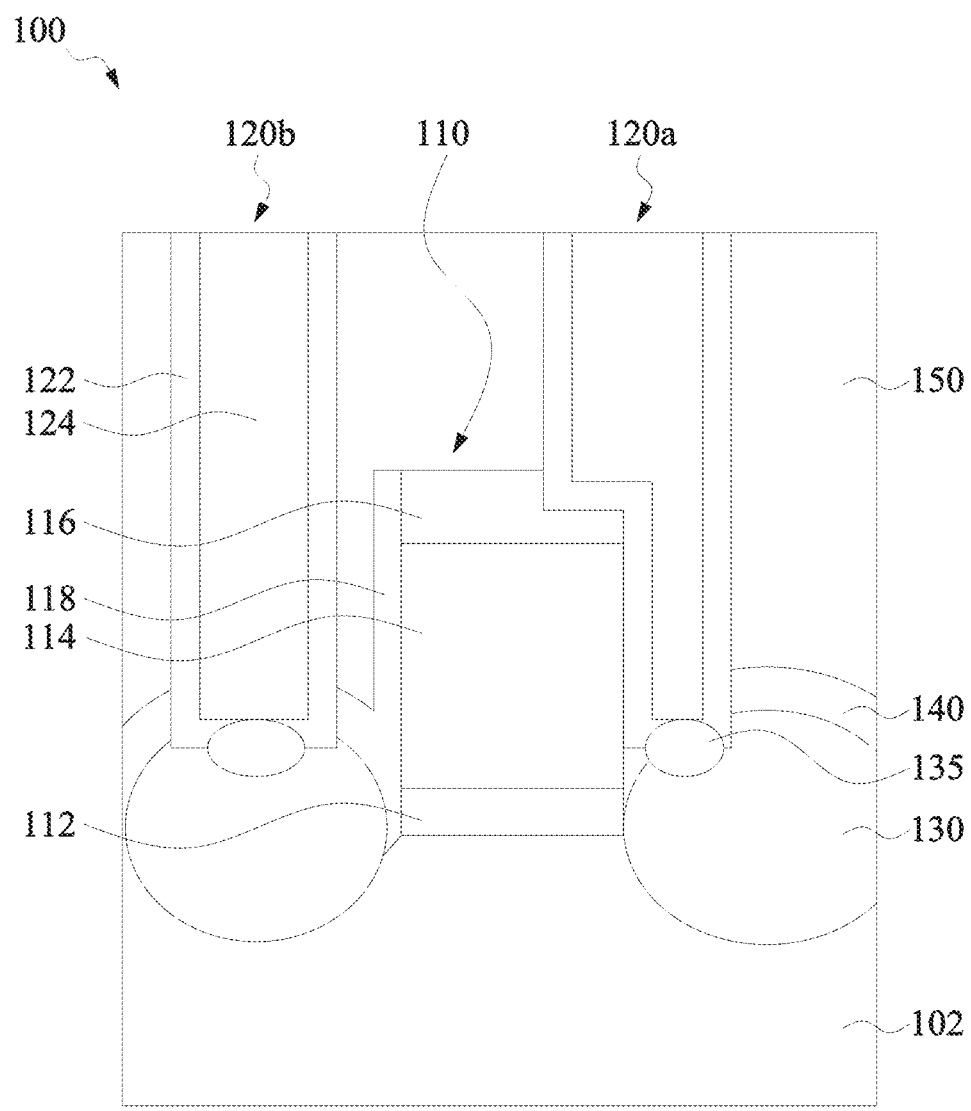
FIG. 1 is a cross sectional view of a semiconductor device in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Efficient transfer of signals to and from semiconductor devices, such as transistors, helps to increase speed and decrease power consumption of the semiconductor devices. Reducing resistance at interfaces helps to increase efficient signal transfer. Depositing a titanium-containing layer in a contact opening prior to filling the contact opening with a conductive plug helps to reduce a contact resistance at an interface between the conductive plug and a silicide layer on a source/drain (S/D) region of a semiconductor device. The titanium-containing layer further acts as a glue layer to improve adhesion to the conductive plug and a barrier layer to prevent inter-diffusion. The deposition process helps to increase a contact area between the silicide layer and the conductive plug because of re-deposition of the S/D material contacted by the titanium-containing material for forming the titanium-containing layer. The increased contact area helps to reduce the resistance between the conductive plug and the silicide layer.

S/D regions which include strained materials, i.e., materials which have a different lattice constant from a surrounding substrate, are prone to diffusion during an annealing process used to initiate the silicidation reaction between at least silicon in the S/D region and the titanium-containing material. In some instances, titanium in the titanium-containing material reacts only with germanium from the S/D regions to form a TiGe compound. TiGe compounds are less stable than silicide compounds, such as TiSiGe or $TiSi_2$. The re-deposition of the S/D material during formation of the titanium-containing layer also helps to increase the interaction between silicon and titanium from the titanium-containing material resulting in the formation of more silicide compounds and less TiGe compounds.

Forming more stable compounds by the silicidation process helps to reduce diffusion of compounds in the S/D region during the annealing process. Diffusion of material from the S/D region toward the channel of a semiconductor device increases an amount of current leakage in the semiconductor device. By reducing the amount of diffusion of material from the S/D region, the current leakage of the semiconductor device is maintained.

FIG. 1 is a cross-sectional view of a semiconductor device 100 in accordance with some embodiments. Semiconductor device 100 includes a substrate 102; a gate structure 110; a first contact 120a; a second contact 120b; S/D regions 130; a silicide region 135; a contact etch stop layer (CESL) 140 and an interlayer dielectric (ILD) 150. First contact 120a extends over a top of gate structure 110. In some embodiments, first contact 120a is separate from the top of gate structure 110. First contact 120a and second contact 120b extend through ILD 150 and CESL 140 to electrically connect to S/D regions 130 by passing electrical signals through silicide region 135. In some embodiments, semiconductor device 100 is a fin field effect transistor (FinFET), a metal-oxide-semiconductor field effect transistor (MOSFET), a gate-all-around (GAA) transistor, or another suitable semiconductor device.

Gate structure 110 includes a gate dielectric layer 112. A gate electrode 114 is over gate dielectric layer 112. A capping layer 116 is over gate electrode 114. Spacers 118 surround sidewalls of gate dielectric layer 112, gate electrode 114 and capping layer 116. Gate structure 110 is over a channel region of semiconductor device 100 in substrate 102 between S/D regions 130. In some embodiments, gate structure 110 includes a work-function layer between gate dielectric layer 112 and gate electrode 114. In some embodiments, gate structure 110 includes additional layers such as a wetting layer, a liner layer or other suitable layers.

Gate dielectric layer 112 is a planar gate dielectric layer. In some embodiments, gate dielectric layer 112 extends up sidewalls of gate electrode 114 to form a U-shaped gate dielectric layer. Gate dielectric layer 112 includes a high-k dielectric material. A high-k dielectric material has a dielectric constant (k) greater than a dielectric constant of silicon dioxide. Gate dielectric layer 112 includes a single dielectric layer. In some embodiments, gate dielectric layer 112 includes multiple layers of dielectric materials.

Gate electrode 114 is a conductive material. In some embodiments, gate electrode includes polysilicon. In some embodiments, gate electrode includes a metallic material.

Capping layer 116 protects gate electrode 114 during processing steps used to form an opening for first contact 120a and second contact 120b. Capping layer 116 includes a dielectric material having a different etch selectivity from spacers 118 and from ILD 150. In some embodiments, capping layer 116 includes silicon nitride, silicon oxide, silicon oxynitride or another suitable dielectric material.

Spacers 118 separate gate dielectric layer 112, gate electrode 114 and capping layer 116 from ILD 150 and CESL 140. In some embodiments, spacers 118 are configured to define a lightly doped drain (LDD) region to help prevent hot carrier injection (HCI). Spacers 118 also help to provide electrical isolation for gate structure 110 to help minimize cross-talk between neighboring conductive components. Spacers 118 include dielectric material. In some embodiments, spacers 118 include silicon nitride, silicon oxide, silicon oxynitride, combinations thereof or other suitable dielectric materials. In some embodiments, spacers 118 include an oxide-nitride-oxide (ONO) structure.

First contact 120a extends through ILD 150 and CESL 140 to electrically connect to one of the S/D regions 130 by passing electrical signals through silicide region 135. First contact 120a includes a portion over gate structure 110. The portion of first contact 120a over gate structure 110 is a result of a material removal process, such as an etching process used to form an opening for first contact 120a. In some embodiments, the material removal process removed a portion of capping layer 116. In some embodiments, the material removal process removed a portion of spacers 118. As a result, the portion of first contact 120a extends below a top surface of capping layer 116 and into a portion of spacers 118 adjacent to the S/D region 130 electrically connected to first contact 120a. In some embodiments, first contact 120a does not extend over gate structure 110; and has a shape similar to second contact 120b.

Second contact 120b extends through ILD 150 and CESL 140 to electrically connect to one of the S/D regions 130 through silicide region 135 on an opposite side of gate structure 110 from first contact 120a. Second contact 120b does not include a portion extending over gate structure 110. A portion of ILD 150 exists between second contact 120b and gate structure 110. In some embodiments, second contact 120b extends over gate structure 110 and first contact 120a does not extend over gate structure 110.

First contact 120a and second contact 120b both include a liner 122 and a plug 124. The liner 122 is between plug 124 and ILD 150 or CESL 140. Liner 122 assists with the deposition of plug 124 and helps to reduce diffusion of a material of plug 124 through ILD 150 or CESL 140. Liner 122 includes a titanium-containing material. The titanium-containing material includes titanium, titanium nitride (TiN) or another suitable titanium-containing material. Plug 124 includes a conductive material. In some embodiments, plug 124 includes tungsten, copper, aluminum or another suitable conductive material.

S/D regions 130 include a strained material. In some embodiments, S/D regions include silicon germanium (SiGe), silicon carbide (SiC) or another suitable strained material. S/D regions 130 include a substantially homogenous composition throughout the S/D regions 130. A substantially homogeneous composition means that a ratio of materials in the S/D regions 130 remains nearly constant across an entirety of S/D regions 130. In some embodiments, S/D regions 130 include a plurality of different regions having different compositions. For example, a germanium concentration varies across S/D regions 130, in some embodiments. At least one example of S/D regions 130 including a plurality of regions is provided in FIG. 4. In some embodiments, S/D regions 130 include silicon germanium (SiGe) for p-type transistors or silicon carbide (SiC) for n-type transistors.

Silicide region 135 is between S/D regions 130 and first contact 120a and second contact 120b. Silicide region 135 provides a low resistance interface between S/D regions 130 and first contact 120a and second contact 120b. Silicide region 135 includes titanium and silicon. In some embodiments, silicide region 135 comprises at least one of $TiSi_2$, TiSiGe or TiSiC. Silicide region 135 includes extensions extending along sidewalls of first contact 120a and second contact 120b, as best seen in FIGS. 3 and 4.

CESL 140 provides an etch stop barrier between ILD 150 and S/D regions 130. CESL 140 is a dielectric material having a different etch selectivity from ILD 150. In some embodiments, CESL 140 includes silicon nitride, silicon oxide, silicon oxynitride or another suitable dielectric material. In some embodiments, CESL 140 includes a same material as spacers 118 and/or capping layer 116. In some embodiments, CESL 140 includes a different material from at least one of spacers 118 and/or capping layer 116.

ILD 150 provides electrical isolation for semiconductor device 100 and adjacent devices within a die or package. ILD 150 includes a dielectric material. In some embodiments, ILD 150 includes silicon nitride, silicon oxide, silicon oxynitride or another suitable dielectric material. In some embodiments, ILD 150 includes a same material as spacers 118 and/or capping layer 116. In some embodiments, ILD 150 includes a different material from at least one of spacers 118 and/or capping layer 116.

Figure 2:
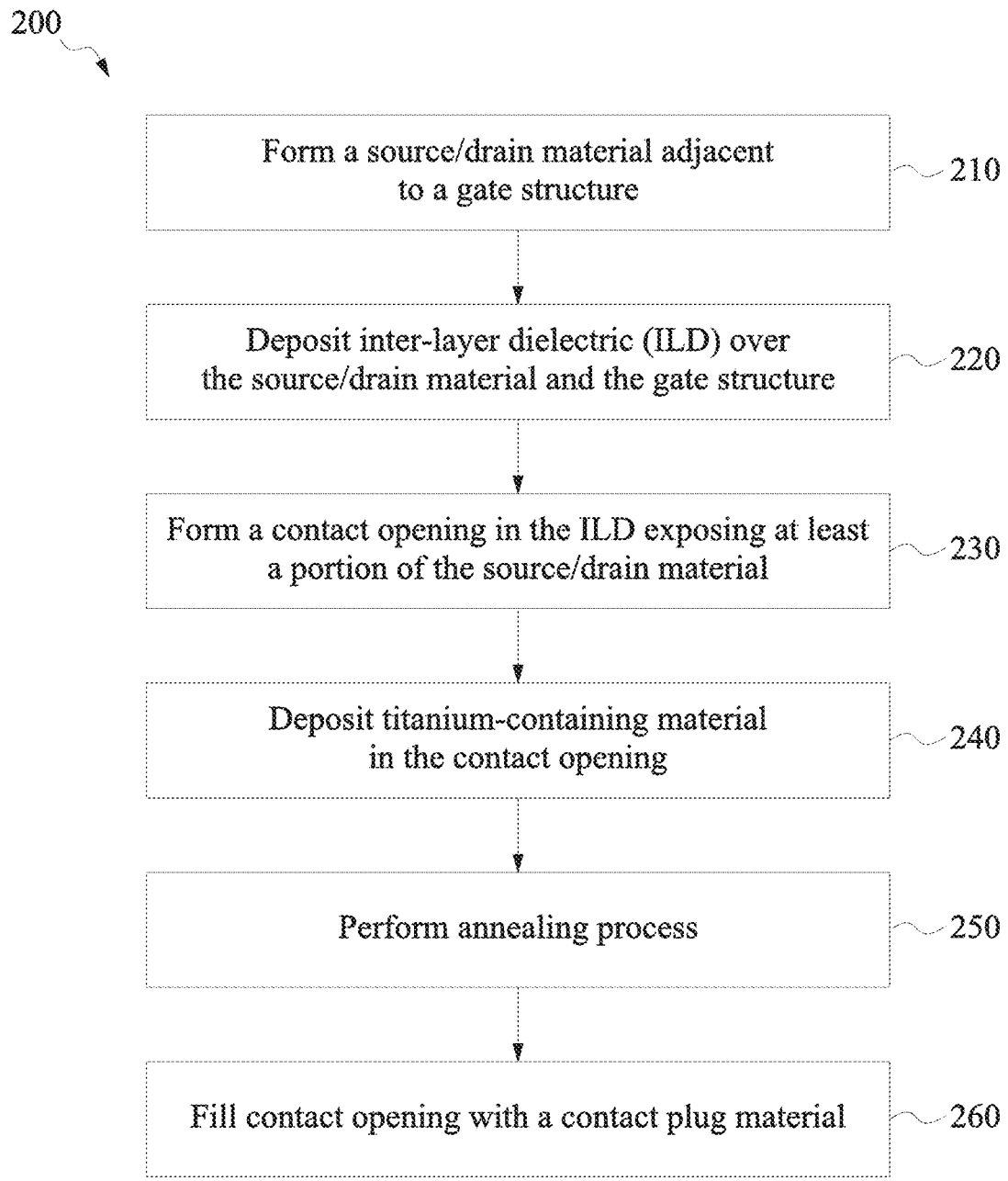
FIG. 2 is a flowchart of a method of making a semiconductor device in accordance with some embodiments.

FIG. 2 is a flowchart of a method 200 of forming a semiconductor device in accordance with some embodiments. In operation 210, source/drain (S/D) regions are formed in a substrate adjacent to a gate structure. In some embodiments, the gate structure, e.g., gate structure 110 (FIG. 1), includes a high-k dielectric layer, a metal gate electrode, and a spacer surrounding the high-k dielectric layer and the metal gate electrode. In some embodiments, the gate structure also includes a capping layer, such as silicon nitride, over the metal gate electrode.

The S/D regions are formed by creating recesses in the substrate on opposite sides of the gate structure. In some embodiments, the recesses are formed by a photolithography and etching process. In some embodiments, the etching process is a dry etching process. In some embodiments, the etching process is a wet etching process. In some embodiments, a cleaning process follows the etching process. In some embodiments, the recesses are formed using a laser drilling process or another suitable material removal process. The recesses are then filled with S/D materials which have a different lattice constant from the substrate. In some embodiments, the S/D materials include SiGe, SiC or other suitable S/D materials. In some embodiments, the recesses are filled using an epitaxial process. In some embodiments, the S/D regions have a top surface protruding above a top surface of the substrate. In some embodiments, the S/D regions have a top surface substantially co-planar with a top surface of the substrate.

In operation 220, an inter-layer dielectric (ILD) is formed over the source/drain regions and the gate structure. The ILD, e.g., ILD 150 (FIG. 1), helps to electrically insulate components of the semiconductor device from other components of a die or package. In some embodiments, the ILD includes silicon oxide, silicon nitride, silicon oxynitride or another suitable dielectric material. In some embodiments, the ILD is formed using chemical vapor deposition (CVD), high-density CVD (HDCVD), or another suitable deposition process. In some embodiments, a planarization process is performed on the ILD to define a top surface of the ILD substantially co-planar with a top surface of the gate structure. In some embodiments, the planarization process is performed later in method 200.

In operation 230, contact openings are formed in the ILD to expose a portion of the source/drain regions. The contact openings also extend through a CESL, e.g., CESL 140 (FIG. 1). In some embodiments, the contact openings are formed by a photolithography and etching process. In some embodiments, the etching process is a dry etching process. In some embodiments, the etching process is an anisotropic etching process. In some embodiments, a cleaning process, such as a wet etching process, is performed to help remove debris and by-products of an etching process used to form the contact opening.

In some embodiments, none of the contact openings overlap with the gate structure. In some embodiments, at least one of the contact openings partially overlaps with the gate structure. The capping layer of the gate structure helps to protect the gate electrode in embodiments where the contact opening partially overlaps with the gate structure. In some embodiments, forming the contact opening removes a portion of a spacer of the gate structure.

In operation 240, a titanium-containing layer is deposited in the contact opening. The titanium-containing layer is deposited using a high energy sputtering process. The high energy sputtering process bombards the exposed surface of the source/drain material with the titanium-containing material as well as a carrier gas, such as argon, nitrogen or another suitable carrier gas. As a result, portions of the S/D material detach from the source/drain regions and re-deposit along sidewalls of the ILD defined by the contact opening. The result of the re-depositing of the S/D material is the formation of tapered protrusions of S/D material which extend from a top surface of the S/D regions up the sidewalls of the ILD. The protrusions are wider closer to the S/D regions and taper to a point as a distance from the S/D regions increases. In some embodiments, the protrusions extend up the sidewalls of the ILD a distance from the top surface of the source/drain ranging from about 3 nanometers (nm) to about 7 nm. In some embodiments, the protrusions extend up the sidewalls of the ILD a distance from the top surface of the source/drain of about 5 nm. In some embodiments, a width of the protrusions closest to the top surface of the S/D regions ranges from about 4 nm to about 6 nm. In some embodiments, a width of the protrusions closest to the top surface of the source/drain is about 5 nm. In some embodiments, a width of the protrusions farthest from the top surface of the source/drain ranges from about 0.5 nm to about 1.5 nm. In some embodiments, a width of the protrusions farthest from the top surface of the source/drain is about 1 nm. As a size of the protrusions increases an amount of contact area between a contact plug, e.g. plug 124 (FIG. 1), and the silicide region increases; however, increasing the size of the protrusions also increases an energy of the sputtering process and increases damage to the S/D regions.

In some embodiments, a bias power of the sputtering process ranges from about 50 watts (W) to about 1000 W, so that the charged ions and molecules in the titanium-containing material and the carrier gas can bombard the S/D regions. In some embodiments, a combined flow rate of the titanium-containing material and the carrier gas ranges from about 5 sccm to about 500 sccm. In some embodiments, the pressure of the sputter chamber ranges from about 0.01 mTorr to about 100 mTorr. In some embodiments, the plasma power ranges from about 50 W to about 10000 W. In some embodiments, the sputtering process is performed in a temperature ranging from about room temperature (RT) to about 200° C. Parameters of the sputtering process are adjustable to control a size of the protrusions formed by re-deposition of S/D material from the S/D regions removed from the S/D regions by the sputtering process.

In some embodiments, the titanium-containing material includes titanium or titanium nitride. The titanium-containing layer extends along an entirety of the contact opening. In embodiments where the contact opening partially overlaps with the gate structure, the titanium-containing layer is deposited over the gate structure.

In operation 250, an annealing process is performed to form a silicide material. During the annealing process, titanium from the titanium-containing layer reacts with silicon and other components of the source/drain material to form a silicide material. The silicide material is also formed in the protrusions. By forming the silicide material in the protrusions as well as on the top of the S/D regions, a contact area between the contact plug and the silicide increases and a resistance at the contact plug/silicide interface is reduced. In some embodiments, the annealing process is performed at a temperature ranging from about 500° C. to about 600° C. for a duration ranging from about 20 seconds to about 60 seconds. Parameters of the annealing process are adjustable to control an amount of silicide formed during the annealing process and to help control diffusion of S/D materials during the annealing process. A lower temperature and faster anneal reduce a risk of diffusion of the S/D materials from the S/D regions to reduce the risk of leakage current. The reaction between the titanium-containing material and the silicon helps to lower the Schottky barrier between the contact plug in comparison with a contact plug directly on the source/drain material, which also reduces a resistance between the contact plug and the silicide material.

In some embodiments, the annealing process causes several different compounds to form. For example, in some embodiments where the S/D regions include SiGe, the annealing process causes the formation of TiSi$_2$ and TiSiGe. Both of these compounds are more stable than a TiGe compound. As a result, TiSi$_2$ and TiSiGe are less likely than TiGe to diffuse through the substrate during the anneal process. TiGe diffusing through the substrate during the anneal process increases a risk of a conductive path forming between the gate structure and the S/D regions, which increases the risk of current leakage. Current leakage increases power consumption and increases the risk of the semiconductor device functioning improperly.

In some embodiments, the annealing process results in several different regions within the source/drain. An outer region of the source/drain surrounds an inner region of the source/drain in a U-shaped configuration. Each region of the source/drain has a different concentration of materials because of the silicidation reaction caused by the annealing process. In some embodiments, more than two regions of the source/drain are formed by the annealing process. For example, in some embodiments, an inner-most region of the source/drain has an intermediate concentration of Ge; a second region of the source/drain surrounding the inner-most region has a highest concentration of Ge; and an outer-most region of the source/drain surrounding the second region has a lowest concentration of Ge.

In operation 260, a contact plug is then deposited to fill a remaining portion of the contact opening. In some embodiments, the contact plug includes tungsten, aluminum, copper or another suitable material. In some embodiments, the contact plug is deposited by physical vapor deposition (PVD), sputtering, plating or another suitable deposition process. The contact plug is electrically connected with an S/D region through the silicide layer.

In some embodiments, method 200 includes additional steps, such as a planarization process following filling the contact opening with the contact plug. In some embodiments, an order of operation of method 200 is adjusted. For example, in some embodiments, the annealing process is performed after deposition of the contact plug. In some embodiments, at least one operation from method 200 is omitted. For example, in some embodiments, operation 220 is omitted and the S/D material is redeposited only along sidewalls of a CESL layer.

In comparison with techniques that do not include the titanium-containing layer, the method 200 helps to form a semiconductor device which has a reduced contact silicide resistance because of the reduced Schottky barrier and increased contact area. As a result, signals are transferred more efficiently within the semiconductor device; speed of the semiconductor device is increased; and power consumption is decreased in comparison with other semiconductor devices.

Figure 3A:
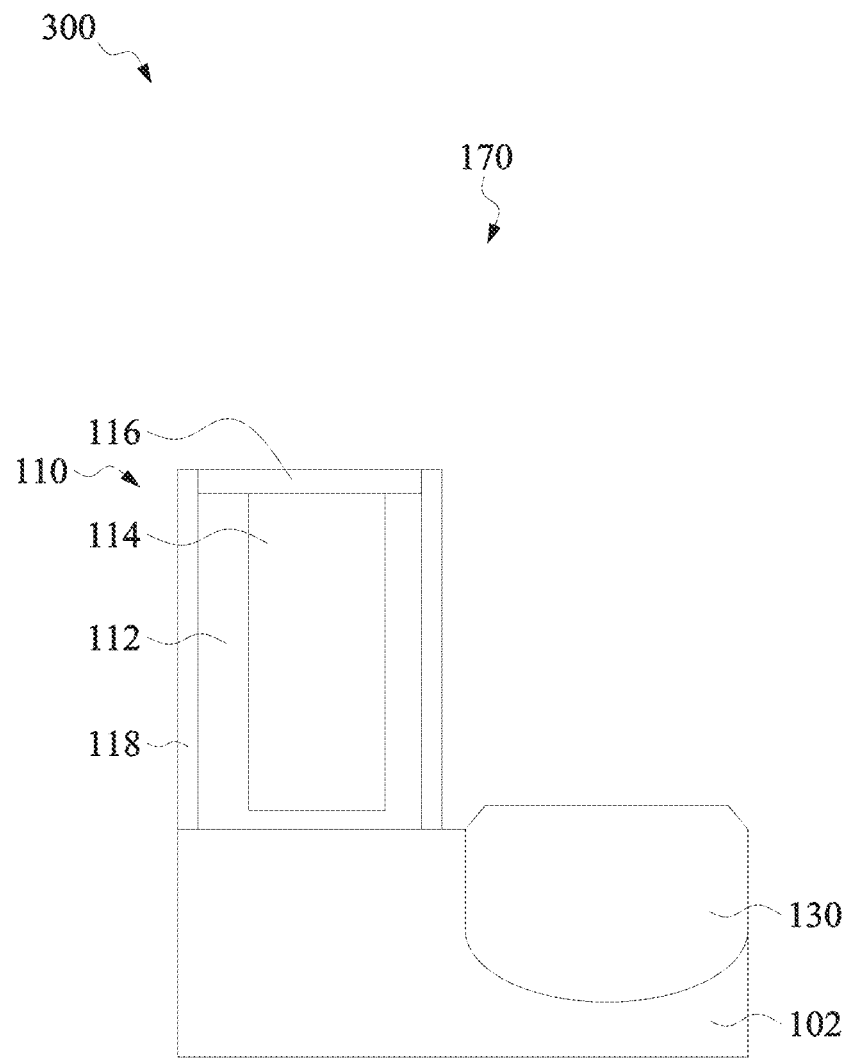
FIGS. 3A-3D are cross sectional views of a semiconductor device at a stage during manufacturing in accordance with some embodiments.
Figure 4:
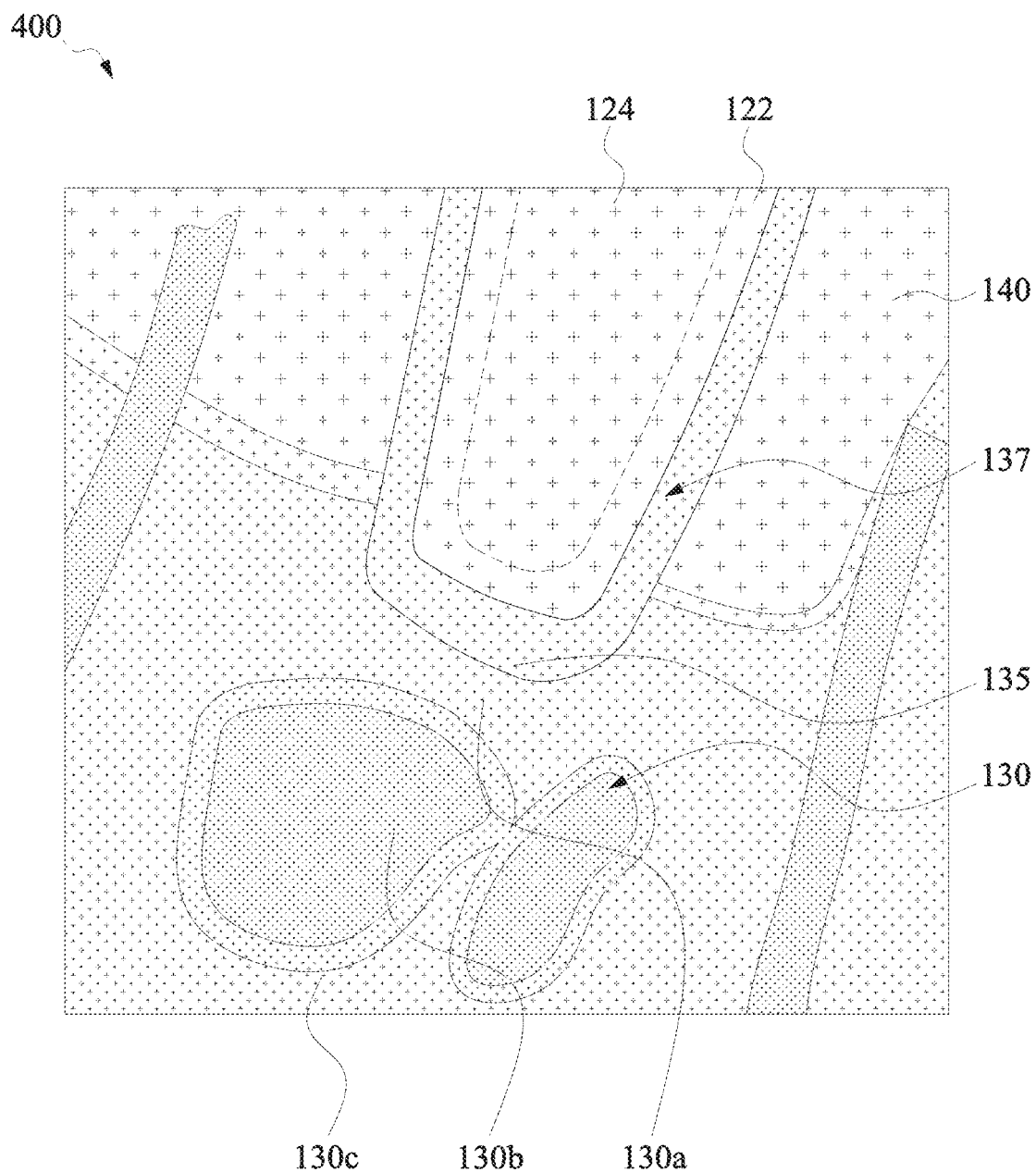
FIG. 4 is an enlarged image of a semiconductor device in accordance with some embodiments.

FIG. 3A is a cross-sectional view of a semiconductor device 300 following formation of a source/drain material. Semiconductor device 300 includes several elements which are the same as elements in semiconductor device 100; and description of these elements is omitted for brevity. In comparison with semiconductor device 100, semiconductor device is a partially formed device. Only one S/D region 130 of semiconductor device 300 is included in FIG. 3A for clarity. One of ordinary skill in the art would understand that semiconductor device 300 includes a plurality of S/D regions 130. Gate structure 110 is over substrate 102. S/D region 130 in substrate 102. S/D region 130 protrudes above a top surface of substrate 102. Semiconductor 300 includes a rounded bottom surface of S/D region 130. In some embodiments, S/D region 130 includes a planar bottom surface or a faceted bottom surface.

Figure 3B:
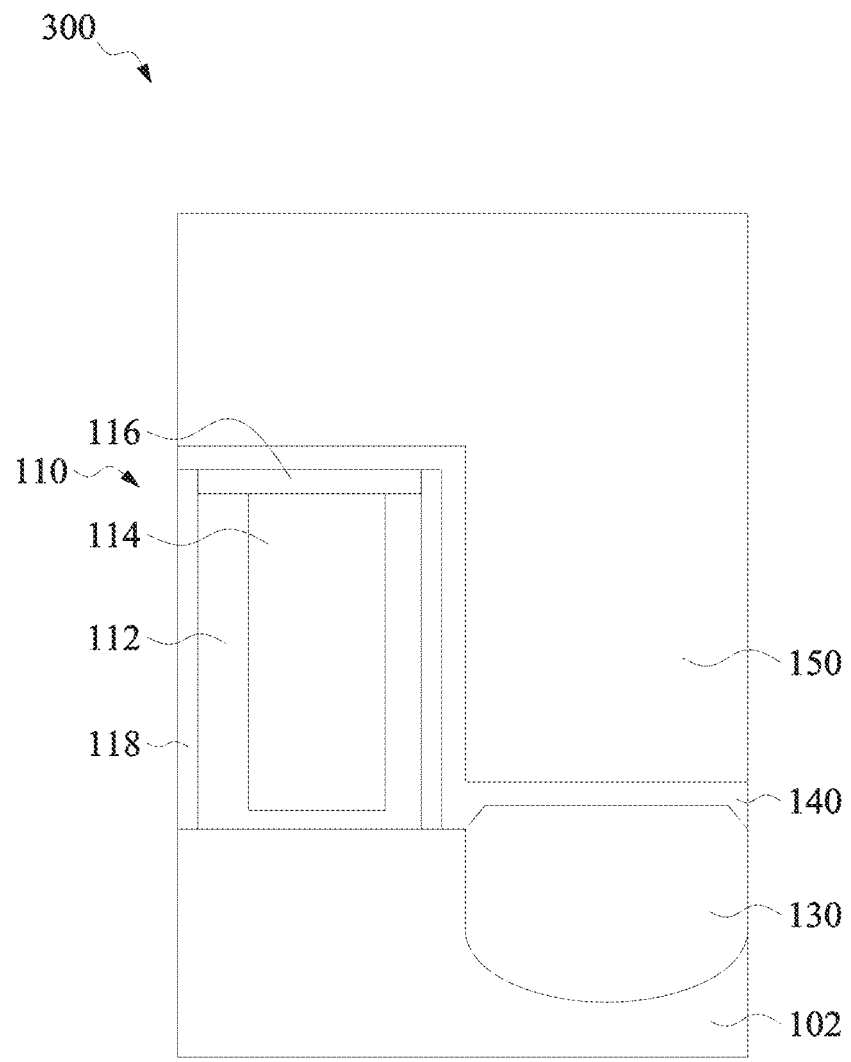

FIG. 3B is a cross-sectional view of a semiconductor device 300 following deposition of an ILD. CESL 140 extends over S/D region 130 along spacer 118 and over gate structure 110. ILD 150 is deposited over CESL 140. In some embodiments, ILD 150 is planarized following deposition of the dielectric material in order to have a top surface substantially co-planar with a top surface of gate structure 110.

Figure 3C:
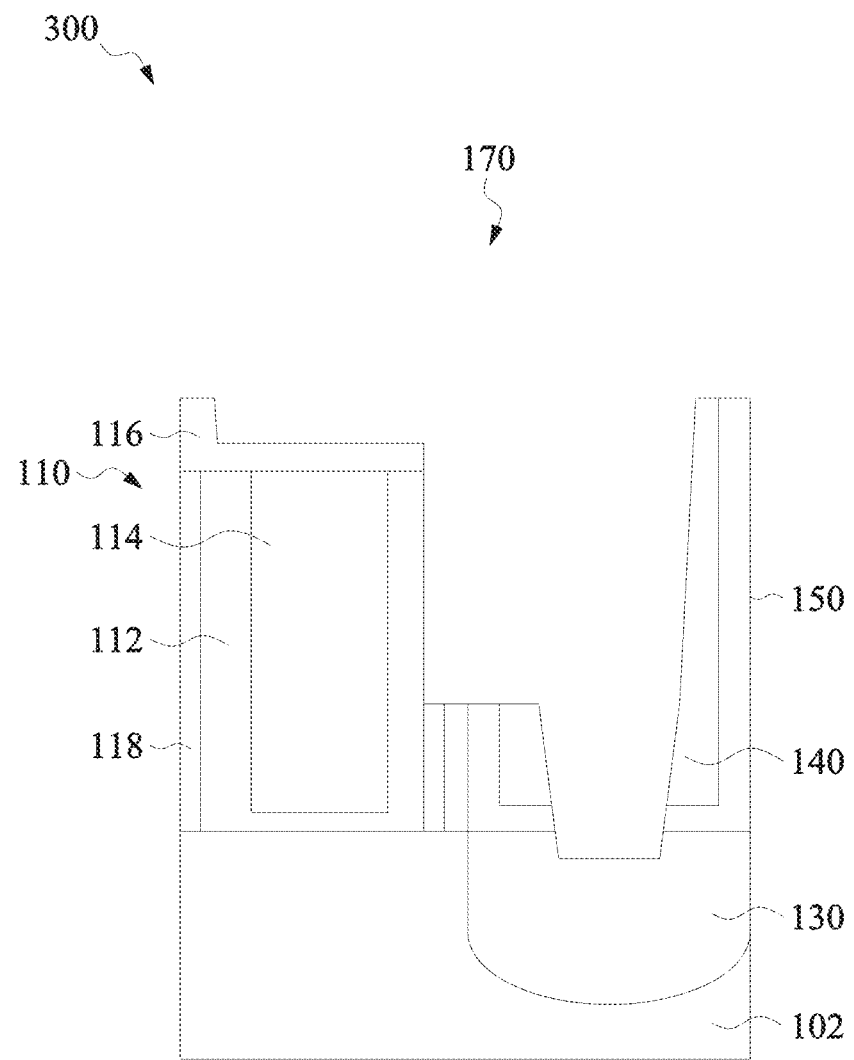

FIG. 3C is a cross-sectional view of a semiconductor device 300 following formation of a contact opening in the ILD. Contact opening 170 is formed in ILD 150 and CESL 140 to expose S/D region 130. Contact opening 170 also removes portions of spacer 118 and cap layer 116.

Figure 3D:
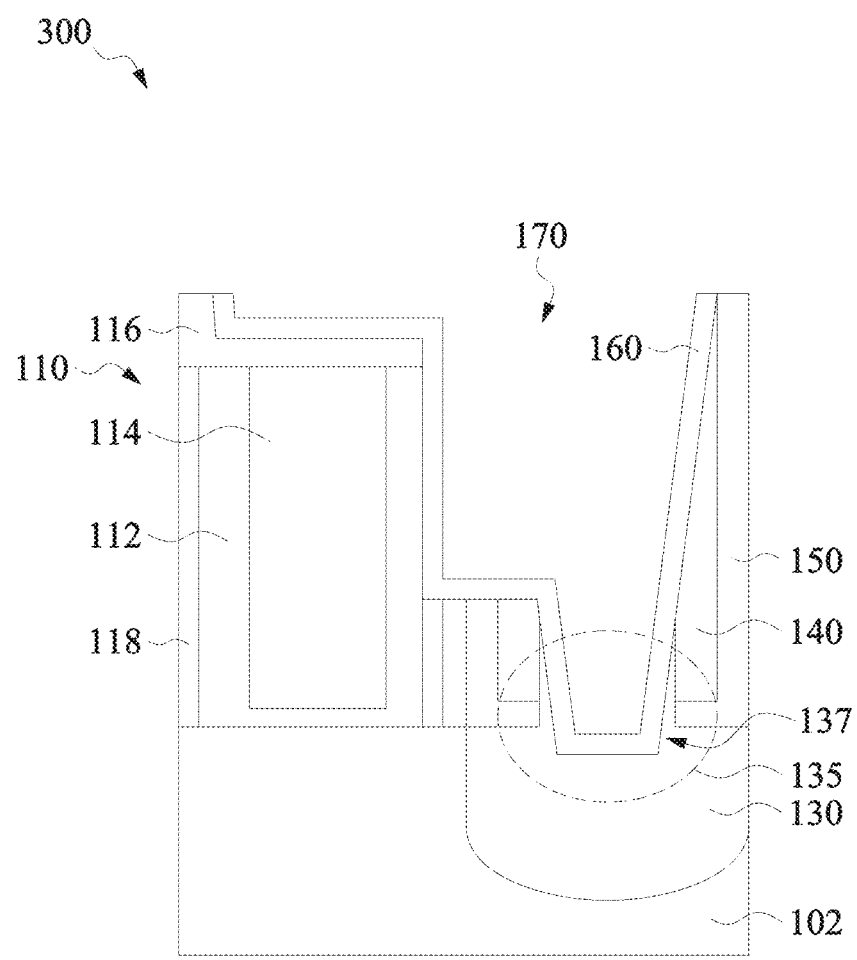

FIG. 3D is a cross-sectional view of a semiconductor device 300 following deposition of a titanium-containing material. Titanium-containing layer 160 extends along an entirety of the contact opening 170. Titanium-containing layer 160 is deposited using a high-energy sputtering process in order to remove portions of S/D region 130. The removed portions of S/D region 130 are re-deposited along sidewalls of the contact opening 170 to form protrusions 137 in silicide region 135.

Protrusions 137 are thicker adjacent to the top surface of S/D region 130 and taper to a point as distance from the top surface of S/D region 130 increases. In some embodiments, a height of protrusions 137 from the top surface of S/D region 130 ranges from about 3 nm to about 7 nm. In some embodiments, a height of the protrusions is about 5 nm. In some embodiments, a width of protrusions 137 closest to the top surface of the source/drain ranges from about 4 nm to about 6 nm. In some embodiments, a width of protrusions 137 closest to the top surface of the source/drain is about 5 nm. In some embodiments, a width of protrusions 137 farthest from the top surface of S/D region 130 ranges from about 0.5 nm to about 1.5 nm. In some embodiments, a width of protrusions 137 farthest from the top surface of S/D region 130 is about 1 nm.

In some embodiments, protrusions 137 are substantially uniform because an amount of material from S/D region re-deposited on each side of contact opening 170 is substantially equal. In some embodiments, one protrusion 137 is larger than another protrusion because of an angle of particles bombarding the S/D region during the sputtering process. For example, in some embodiments where the sputtering process includes particles angled toward gate structure 110, a protrusion 137 closer to gate structure 110 is larger than a protrusion 137 farther from gate structure 110. A size of protrusions 137 is adjustable by altering parameters of the sputtering process. Increasing a size of protrusions 137 helps to increase a contact area between the contact plug 124 and the silicide region 135 to reduce contact resistance. However, increasing the energy of the sputtering process to increase the size of protrusions 137 also increases an amount of damage to S/D region 130.

Titanium-containing layer 160 includes titanium or titanium nitride. Following an annealing process to form silicide region 135, titanium-containing layer 160 becomes liner 122 (FIG. 1). In some embodiments, titanium-containing layer 160 contacts a gate dielectric layer 112 of gate structure 110. In some embodiments, titanium-containing layer 160 is separated from gate dielectric layer 112 by spacers 118 and/or a portion of ILD 150.

Following filling of the contact opening with contact plug material, the structure of the semiconductor device will resemble semiconductor device 100 (FIG. 1).

FIG. 4 is an enlarged image of a semiconductor device 400 in accordance with some embodiments. Semiconductor device 400 includes several elements which are the same as elements in semiconductor device 100; and description of these elements is omitted for brevity. In comparison with semiconductor device 100, semiconductor device 400 depicts sub-regions 130a-130c of S/D region 130. Semiconductor device 400 also depicts protrusions 137 extending upward from S/D region 130. Protrusions 137 in semiconductor device 400 are the same as protrusions 137 in semiconductor device 300 (FIGS. 3A-3D).

Each of sub-regions 130a-130c has a different percentage of components of S/D region 130. Sub-region 130a is closest to silicide region 135 and surrounds silicide region 135 on three sides. Sub-region 130b is below sub-region 130a, such that sub-region 130a separates sub-region 130b from silicide region 135. In some embodiments, sub-region 130b surrounds sub-region 130a on three sides. Sub-region 130c is below sub-region 130b, such that sub-region 130b separates sub-region 130a from sub-region 130c. In some embodiments, sub-region 130c surrounds sub-region 130b on three sides. Sub-regions 130a-130c are all located within S/D region 130, but have different percentages of the components of S/D region 130. The differences in percentage is based on consumption of materials during a silicidation reaction and diffusion of material during the annealing process.

In some embodiments where S/D region 130 includes a SiGe, sub-region 130a has a lowest Ge percentage in comparison with sub-region 130b and sub-region 130c. Sub-region 130b has a highest Ge percentage in comparison with sub-region 130a and sub-region 130c. As a result, a Ge percentage of sub-region 130c is between the Ge percentage of sub-region 130a and the Ge percentage of sub-region 130b.

In some embodiments where S/D region 130 includes a SiC, sub-region 130a has a lowest C percentage, in comparison with sub-region 130b and sub-region 130c. Sub-region 130b has a highest C percentage in comparison with sub-region 130a and sub-region 130c. As a result a C percentage of sub-region 130c is between the C percentage of sub-region 130a and the C percentage of sub-region 130b.

Figure 5:
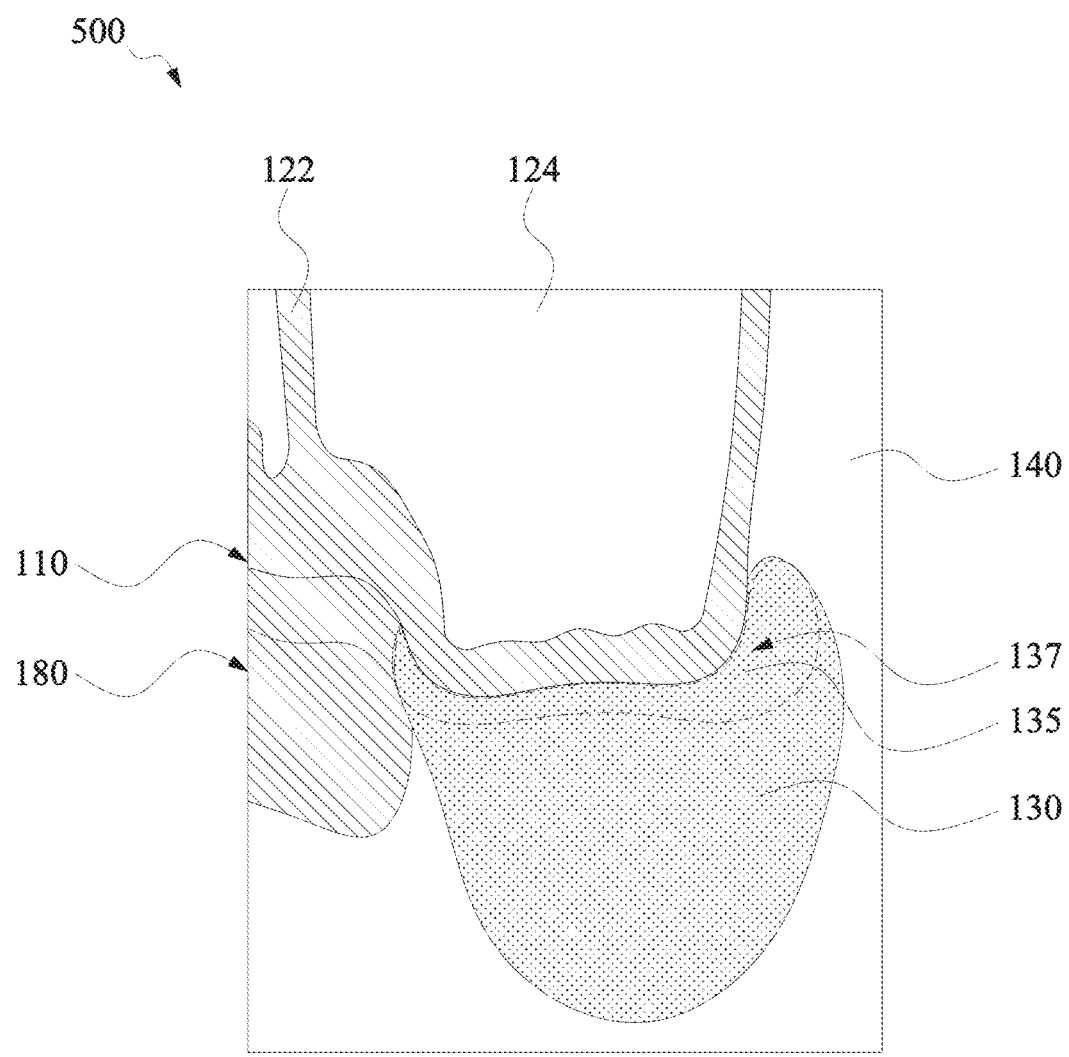
FIG. 5 is an enlarged image of a semiconductor device in accordance with some embodiments.

FIG. 5 is an enlarged image of a semiconductor device 500 in accordance with some embodiments. Semiconductor device 500 includes several elements which are the same as elements in semiconductor device 100; and description of these elements is omitted for brevity. In comparison with semiconductor device 100, semiconductor device 500 clearly depicts liner 122 extending over gate structure and a U-shaped silicide region 135 having protrusions 137. Protrusions 137 in semiconductor device 500 are the same as protrusions 137 in semiconductor device 300 (FIGS. 3A-3D).

Semiconductor device 500 also depicts minimal diffusion of material from S/D region 130 into a channel region 180. The minimal diffusion of material from S/D region 130 into channel region 180 helps to prevent a current leakage path to a gate structure. The diffusion of material from S/D region 130 is minimized due to the formation of more stable compounds, e.g., $TiSi_2$ and TiSiGe, within silicide region 135 during the silicidation reaction. Depositing the titanium-containing layer, e.g., titanium-containing layer 160 (FIG. 3), using a high energy sputtering helps to form a higher percentage of stable compounds because more of the silicon in S/D region 130 is exposed to the titanium-containing layer in comparison with other techniques. The increased amount of silicon available for the silicidation reaction helps to avoid formation for less stable compounds, e.g., TiGe, which are more prone to diffusion.

One aspect of this description relates to a method of forming a semiconductor device. The method includes depositing a titanium-containing material over a source/drain (S/D), wherein an energy of depositing the titanium-containing material is sufficient to cause re-deposition of a material of the S/D along sidewalls of a dielectric layer adjacent the S/D to form protrusions extending from a top surface of the S/D. The method further includes annealing the semiconductor device to form a silicide layer in the S/D and in the protrusions. In some embodiments, the depositing comprises performing a sputtering process using a bias power ranging from about 50 Watts (W) to 1000 W. In some embodiments, the depositing comprises using a plasma power ranging from about 50 W to about 10,000 W. In some embodiments, the annealing is performed at a temperature ranging from about 500° C. to about 600° C. In some embodiments, the annealing is performed for a duration ranging from about 20 seconds to about 60 seconds.

One aspect of this description relates to a device. The device includes a source/drain (S/D) in a substrate and adjacent to a gate structure, wherein the S/D comprises a protrusion extending from a top surface of the S/D, and the protrusion has a tapered profile. The device further includes a silicide layer in the protrusion, wherein the silicide layer comprises titanium. The device further includes a contact plug electrically connected to the protrusion through the silicide layer. In some embodiments, a height of the protrusion above the top surface of the S/D ranges from about 3 nanometers (nm) to about 7 nm. In some embodiments, a width of the protrusion closes to the top surface of the S/D ranges from about 4 nm to about 6 nm. In some embodiments, a width of the protrusion farthest to the top surface of the S/D ranges from about 0.5 nm to about 1.5 nm. In some embodiments, the silicide layer extends along the top surface of the S/D.

One aspect of this description relates to a device. The device includes a gate structure over a substrate. The device includes a source/drain (S/D) in the substrate adjacent to the gate structure, wherein the S/D comprises at least one protrusion extending from a top surface of the S/D. The device includes a silicide layer extending along the at least one protrusion and along the top surface of the S/D. The device includes a contact plug electrically connected to the at least one protrusion and the S/D through the silicide layer. In some embodiments, a width of the at least one protrusion is constant as a distance from the S/D increases. In some embodiments, the at least one protrusion comprises a plurality of protrusions, and the silicide layer extends along each protrusion of the plurality of protrusions. In some embodiments, the device further includes an inter-layer dielectric (ILD) over the S/D. In some embodiments, the top surface of the S/D contacting the silicide layer is recess with respect to a top surface of the S/D under the ILD. In some embodiments, the at least one protrusion extends along the ILD. In some embodiments, a height of the protrusion above the top surface of the S/D ranges from about 3 nanometers (nm) to about 7 nm. In some embodiments, the S/D comprises germanium. In some embodiments, the at least one protrusion has a tapered profile. In some embodiments, a concentration of germanium in the S/D varies along a direction parallel to a top surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   depositing a titanium-containing material over a source/drain (S/D), wherein an energy of depositing the titanium-containing material is sufficient to cause re-deposition of a material of the S/D along sidewalls of a dielectric layer adjacent the S/D to form protrusions extending from a top surface of the S/D; and
   annealing the semiconductor device to form a silicide layer in the S/D and in the protrusions.

2. The method of claim 1, wherein the depositing comprises performing a sputtering process using a bias power ranging from about 50 Watts (W) to 1000 W.

3. The method of claim 1, wherein the depositing comprises using a plasma power ranging from about 50 W to about 10,000 W.

4. The method of claim 1, wherein the annealing is performed at a temperature ranging from about 500° C. to about 600° C.

5. The method of claim 1, wherein the annealing is performed for a duration ranging from about 20 seconds to about 60 seconds.

6. A device comprising:
   a source/drain (S/D) in a substrate and adjacent to a gate structure, wherein the S/D comprises a protrusion extending from a top surface of the S/D, and the protrusion has a tapered profile;
   a silicide layer in the protrusion, wherein the silicide layer comprises titanium; and
   a contact plug electrically connected to the protrusion through the silicide layer.

7. The device of claim 6, wherein a height of the protrusion above the top surface of the S/D ranges from about 3 nanometers (nm) to about 7 nm.

8. The device of claim 6, wherein a width of the protrusion closest to the top surface of the S/D ranges from about 4 nm to about 6 nm.

9. The device of claim 6, wherein a width of the protrusion farthest to the top surface of the S/D ranges from about 0.5 nm to about 1.5 nm.

10. The device of claim 6, wherein the silicide layer extends along the top surface of the S/D.

11. A device comprising:
    a gate structure over a substrate;
    a source/drain (S/D) in the substrate adjacent to the gate structure, wherein the S/D comprises at least one protrusion extending from a top surface of the S/D;
    a silicide layer extending along the at least one protrusion and along the top surface of the S/D, wherein the silicide layer extends along an entire sidewall of the at least one protrusion; and
    a contact plug electrically connected to the at least one protrusion and the S/D through the silicide layer.

12. The device of claim 11, wherein a width of the at least one protrusion is constant as a distance from the S/D increases.

13. The device of claim 11, wherein the at least one protrusion comprises a plurality of protrusions, and the silicide layer extends along each protrusion of the plurality of protrusions.

14. The device of claim 11, further comprising an interlayer dielectric (ILD) over the S/D.

15. The device of claim 14, wherein the top surface of the S/D contacting the silicide layer is recessed with respect to a top surface of the S/D under the ILD.

16. The device of claim 14, wherein the at least one protrusion extends along the ILD.

17. The device of claim 11, wherein a height of the protrusion above the top surface of the S/D ranges from about 3 nanometers (nm) to about 7 nm.

18. The device of claim 11, wherein the S/D comprises germanium.

19. The device of claim 11, wherein the at least one protrusion has a tapered profile.

20. The device of claim 11, wherein a concentration of germanium in the S/D varies along a direction parallel to a top surface of the substrate.

* * * * *